(12) United States Patent
Choung et al.

(10) Patent No.: US 10,825,844 B2
(45) Date of Patent: Nov. 3, 2020

(54) THIN FILM TRANSISTOR ARRAY SUBSTRATE MINIMIZING UNWANTED REFLECTION OF EXTERNAL LIGHT AND METHOD OF MANUFACTURING THE SAME

(71) Applicant: Samsung Display Co., Ltd., Yongin-Si (KR)

(72) Inventors: Jong Hyun Choung, Suwon-si (KR); Jae Uoon Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/424,388

(22) Filed: May 28, 2019

(65) Prior Publication Data
US 2020/0243563 A1  Jul. 30, 2020

(30) Foreign Application Priority Data
Jan. 24, 2019  (KR) .................. 10-2019-0009113

(51) Int. Cl.
*H01L 27/12* (2006.01)
*H01L 29/786* (2006.01)
*H01L 29/423* (2006.01)
*H01L 29/417* (2006.01)

(52) U.S. Cl.
CPC .......... *H01L 27/124* (2013.01); *H01L 27/127* (2013.01); *H01L 27/1218* (2013.01); *H01L 27/1262* (2013.01); *H01L 27/1288* (2013.01); *H01L 29/41733* (2013.01); *H01L 29/4236* (2013.01); *H01L 29/42384* (2013.01); *H01L 29/78633* (2013.01)

(58) Field of Classification Search
CPC .............. H01L 27/1218; H01L 27/124; H01L 27/1262; H01L 27/127; H01L 27/1288; H01L 29/41733; H01L 29/4236; H01L 29/42384; H01L 29/78633
See application file for complete search history.

(56) References Cited

U.S. PATENT DOCUMENTS

| | | | |
|---|---|---|---|
| 2007/0096096 A1 | 5/2007 | Kuwabara et al. | |
| 2008/0135515 A1 | 6/2008 | Pu et al. | |
| 2009/0174834 A1 | 7/2009 | Choi et al. | |
| 2009/0279012 A1 | 11/2009 | Kuwabara et al. | |
| 2017/0330945 A1* | 11/2017 | Kim | H01L 29/0623 |
| 2019/0103419 A1* | 4/2019 | Wang | H01L 27/1259 |

* cited by examiner

*Primary Examiner* — Andrew Q Tran
(74) *Attorney, Agent, or Firm* — Innovation Counsel LLP

(57) ABSTRACT

A transistor array substrate includes a substrate (having a first trench), a gate electrode (in the first trench), an insulating film, a gate line, a data line, a source electrode, and a drain electrode. The insulating film includes second, third, fourth, fifth, and sixth trenches. The gate line is in the second trench and is not parallel to the data line. The data line includes a first section and a second section that are separated by the gate line and respectively in the third and fourth trenches. The source electrode and the drain electrode are respectively in the fifth and sixth trenches. The source electrode is electrically connected to the data line. The gate electrode is electrically connected to the gate line.

20 Claims, 19 Drawing Sheets

THIN FILM TRANSISTOR ARRAY SUBSTRATE MINIMIZING UNWANTED REFLECTION OF EXTERNAL LIGHT AND METHOD OF MANUFACTURING THE SAME

This application claims priority to and the benefit of Korean Patent Application No. 10-2019-0009113, filed on Jan. 24, 2019 in the Korean Intellectual Property Office; the disclosure of the Korean Patent Application is incorporated herein by reference in its entirety.

BACKGROUND

1. Field

The technical field relates to a thin film transistor array substrate and a method of manufacturing the thin film transistor array substrate.

2. Description of the Related Art

Display devices may include, for example, liquid crystal display devices and organic light emitting display devices. A display device may include a thin film transistor array substrate. The thin film transistor array substrate may include pixels and signal lines connected to transistors of the pixels. The display device may include other elements for providing signals through the signal lines to control the transistors of the pixels.

SUMMARY

Embodiments may be related to a thin film transistor array substrate having reliable signal lines. Embodiments may be related to a method for manufacturing the thin film transistor array substrate.

Embodiments may be related to a thin film transistor array substrate capable of minimizing or preventing unwanted reflection of external light. Embodiments may be related to a method for manufacturing the thin film transistor array substrate.

An embodiment may be related to a transistor array substrate. The transistor array substrate may include a base substrate, a gate electrode, an insulating film, a gate line, a data line, a source electrode, and a drain electrode. The base substrate may include a first trench. The gate electrode may be disposed in the first trench. The insulating film may be disposed on the substrate and may include a second trench, a third trench, a fourth trench, a fifth trench, and a sixth trench. The gate line may transmit a gate signal, may be disposed in the second trench, and may extend in a first direction. The data line may transmit a data signal, may extend in a second direction different from the first direction, and may include a first signal-line section and a second signal-line section. The first signal-line section may be separated from the second signal-line section by at least the gate line and may be disposed in the third trench. The second signal-line section may be disposed in the fourth trench. The source electrode may be disposed in the fifth trench and may be electrically connected the data line. The drain electrode may be disposed in the sixth trench and may be spaced from the source electrode. The gate electrode may be electrically connected to the gate line.

The first signal-line section may be separated from the second signal-line section by at least a first portion of the insulating film and a second portion of the insulating film.

The gate line may be disposed between the first portion of the insulating film and the second portion of the insulating film.

The transistor array substrate may include a connection member. The connection member may be disposed on the insulating film and may electrically connect the first signal-line section to the second signal-line section.

The gate electrode may be electrically connected to the data line.

The transistor array substrate may include a light-absorbing layer. The light-absorbing layer may directly contact and at least partially cover at least one of a face of the gate line and a face of the data line.

The transistor array substrate may include a light-absorbing layer. The light-absorbing layer may directly contact and at least partially cover at least one of a face the source electrode and a face of the drain electrode.

The gate line may be a gate line and may be electrically connected to the gate electrode. The data line may be a data line and may be electrically connected to the source electrode. The gate line, the data line, the source electrode, and the drain electrode may include (or may be formed of) the same material.

Each of the gate line, the data line, the source electrode, and the drain electrode may include (or may be formed of) copper (Cu).

The base substrate may include a base layer and an insulating layer. A material of the base layer may be different from a material layer of the insulating layer. The first trench may be disposed in at least the insulating layer.

The gate electrode may directly contact each of the base layer and the insulating layer.

The gate electrode may directly contact a face of the base layer. The insulating layer may directly contact the face of the base layer.

A thickness of the gate electrode may be equal to a thickness of the insulating layer.

The transistor array substrate may include a light-absorbing layer. The light-absorbing layer may directly contact and at least partially cover the gate line or the data line. The gate line or the data line may be a gate line and may be electrically connected to the gate electrode.

The gate electrode may be thinner than the gate line and thicker than the light-absorbing layer in a direction perpendicular to the base layer.

At least two of a thickness of the gate line, a thickness of the data line, and a thickness of the insulating film may be equal to each other.

Each of the thickness of the gate line and the thickness of the second-type line may be in a range of 3000 angstroms to 30000 angstroms.

An embodiment may be related to method for manufacturing a transistor array substrate. The method may include the following steps: forming a first trench in a substrate; forming a gate electrode in the first trench; forming an insulating film on the gate electrode; forming a second trench, a third trench, a fourth trench, a fifth trench, and a sixth trench in the insulating film, wherein a lengthwise direction of the third trench may be different from a lengthwise direction of the second trench and may be identical to a lengthwise direction of the fourth trench, and wherein the third trench may be separated from the fourth trench by at least the second trench; simultaneously forming a gate line, a first section of a data line, a second section of the data line, a source electrode, and a drain electrode in the second trench, the third trench, the fourth trench, the fifth trench, and the sixth trench, respectively; forming a connection member that connects the first section of a data line to the second section of the data line; and forming a pixel electrode on the insulating film.

The step of forming the connection member may be performed simultaneously with the step of forming the pixel electrode.

The step of forming the gate line, the first section of the data line, the second section of the data line, the source electrode, and the drain electrode may include plating a metal including copper (Cu).

The method may include forming a light-absorbing layer that directly contacts and at least partially covers at least one of the gate line and the data line.

The above structures and steps are illustrated in the drawings.

DETAILED DESCRIPTION OF EMBODIMENTS

Figure 1:
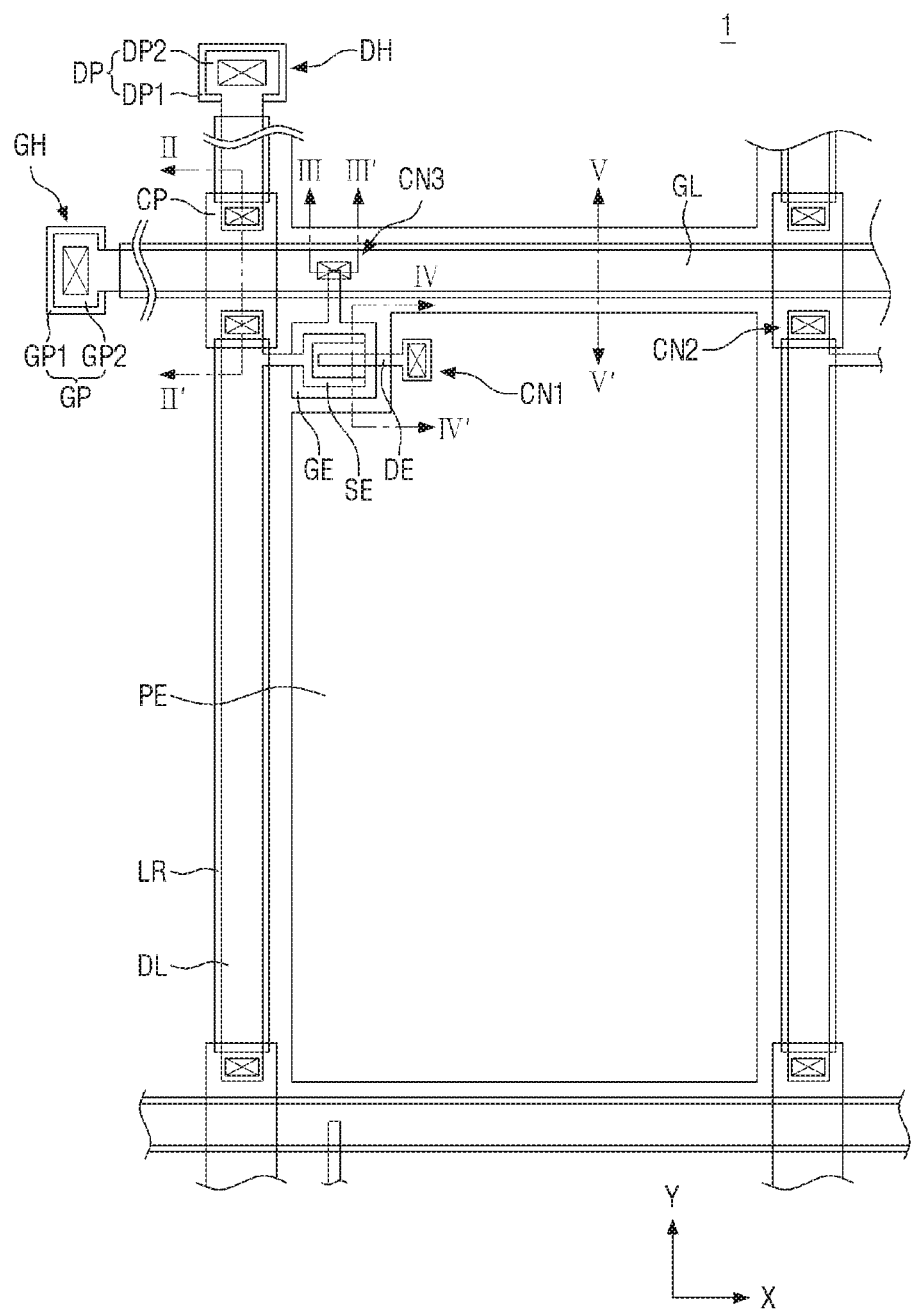
FIG. 1 is a plan view of a thin film transistor array substrate according to an embodiment.

Example embodiments are described with reference to the accompanying drawings. Practical embodiments may be embodied in different forms and should not be construed as limited to the embodiments set forth herein.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present the first element and the second element.

In the specification, same reference numerals may be used for the same or similar parts.

The term "trench" may mean "trench set" or "a trench in the trench set." The term "region" may mean "trench." The term "in" may mean "inside." The term "pattern" may mean "member." The term "low reflection layer" may mean "light-absorbing layer."

Figure 2:
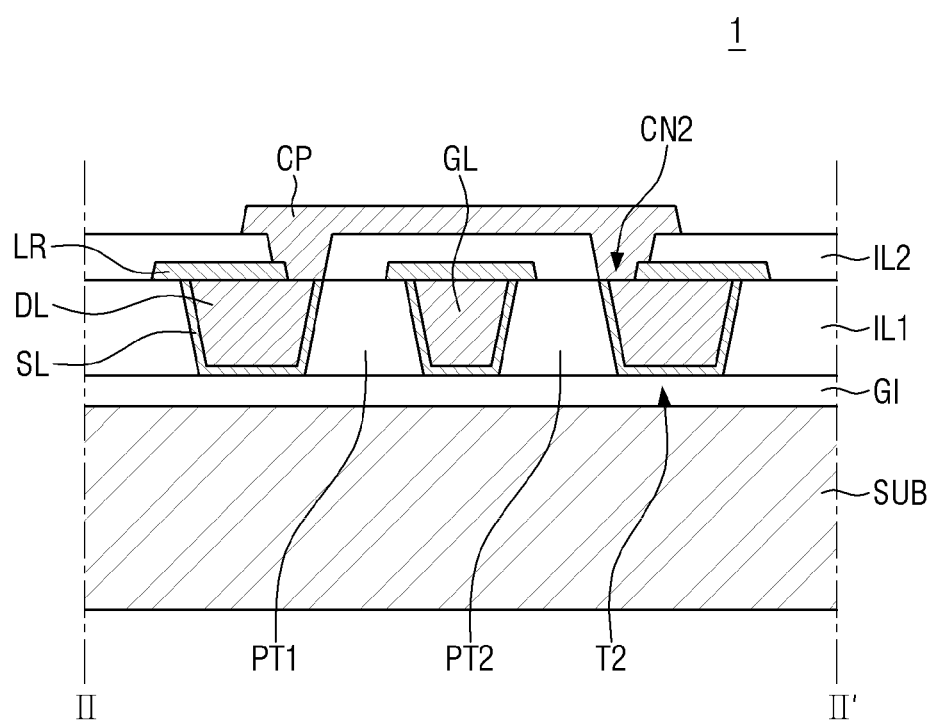
FIG. 2 is a cross-sectional view taken along the line II-II' of FIG. 1 according to an embodiment.
Figure 3:
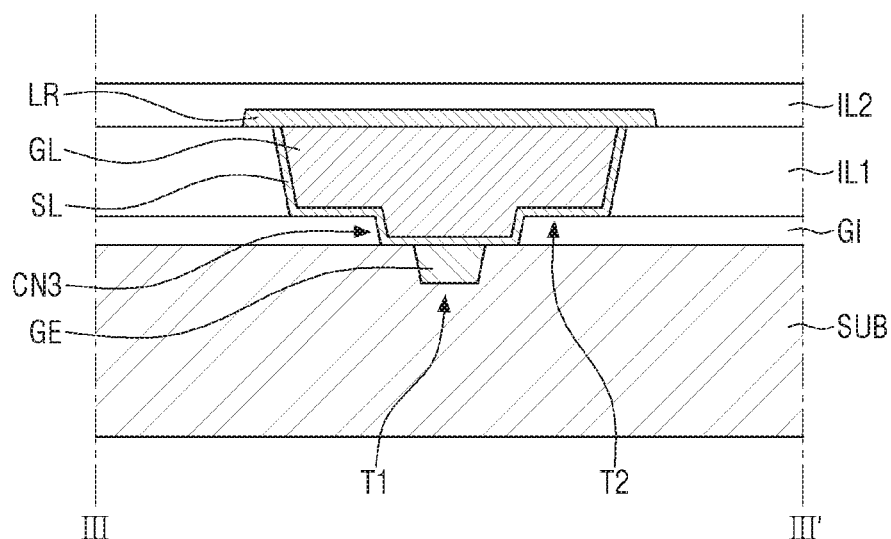
FIG. 3 is a cross-sectional view taken along the line III-III' of FIG. 1 according to an embodiment.
Figure 4:
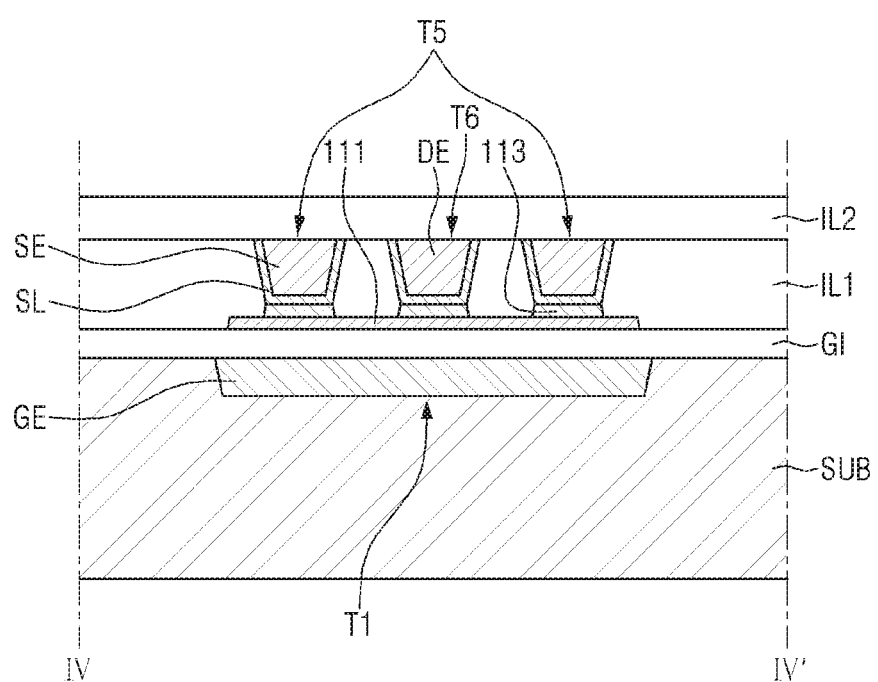
FIG. 4 is a cross-sectional view taken along the line IV-IV' of FIG. 1 according to an embodiment.

FIG. 1 is a plan view of a thin film transistor array substrate 1 according to an embodiment. FIG. 2 is a cross-sectional view taken along the line II-II' of FIG. 1 according to an embodiment. FIG. 3 is a cross-sectional view taken along the line III-III' of FIG. 1 according to an embodiment. FIG. 4 is a cross-sectional view taken along the line IV-IV' of FIG. 1 according to an embodiment.

The thin film transistor array substrate 1 may be included in a display device. The display device may be included in one of various products, such as one of a notebook, a monitor, an internet-of-things (IOT) device, a mobile phone, a smart phone, a tablet personal computer (PC), a smart watch, and a watch phone. The display device may be one of a liquid crystal display device, an organic light emitting display device, a plasma display device, a field emission display device, an electrophoretic display device, an electorwetting display device, a quantum dot light emitting display device, and a micro LED display device.

Referring to FIGS. 1 to 4, the thin film transistor array substrate 1 may include a substrate SUB and a thin film transistor disposed on the substrate SUB (for controlling a pixel of the display device).

The thin film transistor may include a gate electrode GE, a source electrode SE, a drain electrode DE, and a semiconductor layer 111. The gate electrode GE may be electrically connected to a corresponding gate line GL. The gate line GL may receive a gate signal from a scan driver (not shown). The source electrode SE may be connected to a corresponding data line DL and may receive a data signal from a data driver (not shown). The drain electrode DE may be connected to a pixel electrode PE provided of a corresponding pixel.

The thin film transistor array substrate 1 may include a thin film transistor disposed on a substrate SUB and a pixel electrode PE connected to the thin film transistor. The thin film transistor array substrate 1 may further include a gate line GL and a data line DL for transmitting signals to control the thin film transistor and/or the pixel.

A plurality of gate lines GL may extend in a first direction X. The gate lines GL may be spaced from each other in a second direction Y different from the first direction X with pixel regions positioned between the gate lines. A gate pad GP for receiving a signal may be provided at one end of each of the gate lines GL.

The plurality of data lines DL may extend in the second direction Y. The second direction Y may be perpendicular to the first direction X. The data lines DL may be spaced from each other in the first direction X with a pixel regions positioned between the data lines. A data pad DP for receiving a signal may be provided at one end of each of the data lines DL.

One of a data line DL and a gate line GL may include sections that are spaced from each one and are aligned with each other. For example, as shown in FIG. 1, the data lines DL may include two data line sections that are spaced from each other with the gate line GL being positioned between the two data line sections. The sections of the data line DL are spaced from the gate line GL. The sections of the data line DL may be electrically connected through a connection pattern CP. The connection pattern CP may be substantially disposed between the sections of the data line DL and may be aligned with the sections of the data line DL in the second direction Y.

One or more low reflection layers LR may be disposed on each of the gate line GL and the data lines DL. For example, a low reflection layer LR may extend in the first direction X and may at least partially overlap the gate line GL. Two low reflection layers LR may extend in the second direction Y and may at least partially overlap the two sections of the data line DL. Each of the two low reflection layers LR extending in the second direction Y may be spaced from and disposed at opposite sides of the low reflection layer LR extending in the first direction X. That is, the low reflection layers LR overlapping the data line DL may be spaced from the low reflection layer LR overlapping the gate line GL.

A low reflection layer LR may expose the end of the corresponding section of the data line DL. The end of the section of the data line DL exposed by the low reflection layer LR may contact a connection pattern CP.

The gate pad GP may include a first gate pad portion GP1 connected to one end of the gate line GL and a second gate pad portion GP2 disposed on the first gate pad portion GP1.

The second gate pad portion GP2 may be connected to the first gate pad portion GP1 through a gate pad hole GH. The second gate pad portion GP2 may have a larger size than the gate pad hole GH. The second gate pad portion GP2 may be formed of the same material as a pixel electrode PE.

The data pad DP may include a first data pad portion DP1 connected to one end of the data line DL and a second data pad portion DP2 disposed on the first data pad portion DP1.

The second data pad portion DP2 may be connected to the first data pad portion DP1 through a data pad hole DH. The second data pad portion DP2 may have a larger size than the data pad hole DH. The second data pad portion DP2, similarly to the second gate pad portion GP2, may be formed of the same material as the pixel electrode PE.

The thin film transistor includes a gate electrode GE, a semiconductor layer 111, a source electrode SE, and a drain electrode DE. Ohmic contact layers 113 may be laminated between the semiconductor layer 111 and the source electrode SE and between the semiconductor layer 111 and the drain electrode DE.

A part of the gate electrode GE may overlap the gate line GL. In the overlapping region, the gate electrode GE may be electrically connected to the gate line GL through a third contact hole CN3.

The semiconductor layer 111 may overlap the gate electrode GE.

The source electrode SE extends from the data line DL and overlaps the semiconductor layer 111. The drain electrode DE is spaced from the source electrode SE and overlaps the semiconductor layer 111. Although it is illustrated in the drawings that the source electrode SE is a U-shaped source electrode, the source electrode SE may have a different shape, such as a Y-shape or an I-shape. The shape of the drain electrode DE may also be configured differently. The ohmic contact layers 113 may expose a portion of the semiconductor layer 111 not overlapping the source electrode SE and the drain electrode DE.

The pixel electrode PE may partially overlap the drain electrode DE. The pixel electrode PE may be electrically connected to the drain electrode DE through a first contact hole CN1. The pixel electrode PE may be a pixel electrode of a liquid crystal display device or a pixel electrode of an organic light emitting display device.

Referring to FIGS. 2 to 4, the substrate SUB, which is an insulating substrate, may be made of transparent glass or transparent plastic. The substrate SUB may be a rigid substrate or be a flexible substrate capable of bending. For example, the first substrate SUB may be made of thin glass or a polymer material such as polyimide (PI) and may be bendable, foldable, or rollable. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations of some of the aforementioned materials. Alternatively or additionally, the first substrate SUB1 may include a metal material.

A first trench T1 may be formed in the substrate SUB. The first trench T1 may be recessed from the upper surface of the substrate SUB. The plan-view shape of the first trench T1 may be the same as the plan-view shape of the gate electrode GE. As shown in FIGS. 3 and 4, the cross-section of the first trench T1 may be recessed in the thickness direction of the substrate SUB and may have a trapezoidal shape having two side surfaces and a lower surface. The two side surfaces and lower surface of the first trench T1 may be portions of the surface of the substrate SUB. In an embodiment, the first trench T1 may have a concavely curved surface in the thickness direction of the substrate SUB.

The depth of the first trench T1 may be defined as a vertical distance from the highest point of the upper surface of the substrate SUB to the lowest point of the upper surface of the substrate SUB. The depth of the first trench T1 may be shallower than the depth of a trench set TS. The gate electrode GE may be disposed on the substrate SUB. If the gate electrode GE is disposed on the substrate SUB, a step may be formed between the gate electrode GE and the substrate SUB. As the step between the substrate SUB and the upper surface of the gate electrode GE increases, step coverage of a wiring set and/or a layer disposed on the gate electrode GE and the substrate SUB may be insufficient, and thus step coverage failure may occur. As a result, the wiring disposed on the gate electrode GE and the substrate SUB may be thinned or disconnected.

In an embodiment, the gate electrode GE may be disposed inside the first trench T1 of the substrate SUB to prevent the aforementioned failure due to the formation of the step. Since the gate electrode GE is formed inside the first trench T1 of the substrate SUB, the step between the gate electrode GE and the substrate SUB may be reduced by the depth of the first trench T1. The upper surface of the gate electrode GE and the upper surface of the substrate SUB are formed substantially coplanar, so that the step coverage of the wiring and/or layer disposed on the gate electrode GE and the substrate SUB is optimized, and thus the wiring may be stably formed. Although it is illustrated in FIGS. 3 and 4 that one surface of the gate electrode GE and one surface of the substrate SUB are substantially coplanar, the gate electrode GE may be thicker than the first trench T1, such that the gate electrode GE may slightly protrude over/beyond a surface of the substrate SUB.

In an embodiment, the depth of the first trench T1 may be equal to the thickness of the gate electrode GE. In this case, the upper surface of the gate electrode GE and the upper surface of the substrate SUB may form one flat surface.

The gate electrode GE may be formed of at least one of various metals, such as at least one of aluminum (Al), copper (Cu), silver (Ag), molybdenum (Mo), chromium (Cr), nickel (Ni), and neodymium (Nd). The gate electrode GE may be a single layer including one of the aforementioned metals, or may be a single layer including an alloy of some of the aforementioned metals. The gate electrode GE may include double or more layers. For example, the gate electrode GE may have a laminated structure including a titanium layer as a barrier metal and including a copper layer as a low-resistance metal. One or more titanium layers may be laminated beneath, laminated on, or laminated on and beneath the copper layer. The copper layer may be thicker than the titanium layer(s).

A gate insulating film GI may be disposed on the gate electrode GE. The gate insulating film GI may be an inorganic film including at least one of silicon nitride, silicon oxynitride, silicon oxide, titanium oxide, and aluminum oxide, and may be formed as a single layer structure or a double layer structure. The gate electrode GE may be connected to the gate line GL through the third contact hole CN3 penetrating the gate insulating film GI. The gate insulating film GI may be disposed over one surface of the substrate SUB as shown in FIGS. 2 to 4 or may be partially disposed only on the gate electrode GE. The gate insulating film GI may not cover a region where the gate electrode GE overlaps the gate line GL. Thus, the gate electrode GE may be in direct contact with the gate line GL.

The semiconductor layer 111 may be disposed on the gate insulating film GI.

The semiconductor layer 111 forms a channel of the thin film transistor. In an embodiment, the semiconductor layer may include a silicon material (such as amorphous silicon, or polycrystalline silicon) or an oxide semiconductor including indium (In), zinc (Zn), gallium (Ga), or tin (Sn). The semiconductor layer 111 may be made of amorphous silicon.

The ohmic contact layer 113 may be disposed on the semiconductor layer. The ohmic contact layer 113 may be in direct contact with the semiconductor layer 111. The ohmic contact layer 113 may be a silicon layer doped with impurities. For example, the ohmic contact layer 113 may be an amorphous silicon layer doped with n-type impurities.

A first insulating film IL1 may be disposed on the ohmic contact layer 113. The first insulating film IL1 may be an inorganic film, for example, a silicon nitride layer, a silicon oxynitride layer, a silicon oxide layer, a titanium oxide layer, or an aluminum oxide layer.

A trench set TS may be formed in the first insulating film IL1.

The trench set TS may penetrate the first insulating film IL1 in the thickness direction to expose the underlying layer, for example, the substrate SUB, the gate electrode GE, or the gate insulating film GI. The trench set TS may include a side surface and a lower surface. The side surface of the trench set TS may be a portion of the surface of the first insulating film IL1, and the lower surface thereof may be a portion of the surface of the underlying gate insulating film GI. In an embodiment, the trench set TS may be recessed by a predetermined thickness of the first insulating film IL1, and the side surface and lower surface of the trench set TS may be portions of the surface of the first insulating film IL1.

The plan-view shapes of the trench set TS (i.e., the plan-view shapes of trenches of the second trench set T2) may correspond to the plan-view shapes of the data line DL sections, the gate line GL, the source electrode SE, and the drain electrode DE. The trench set TS may include a second trench T2, a third trench T3, a fourth trench T4, a fifth trench T5, and a sixth trench T6. The second trench T2, the third trench T3, the fourth trench T4, the fifth trench T5, and the sixth trench T6 may be spaced from each other. The gate line GL may be disposed in the second trench T2, and the sections of the data line DL may be disposed in the third trench T3 and the fourth trench T4. For example, the data line DL may include a first signal-line section and a second signal-line section. The first signal-line section may be separated from the second signal-line section by at least the gate line GL. The first signal-line section may be disposed in the third trench T3. The second signal-line section may be disposed in the fourth trench T4. The source electrode SE may be disposed in the fifth trench T5 and electrically connected to the data line DL. The drain electrode DE may be disposed in the sixth trench T6 and spaced from the source electrode SE. As shown in FIG. 2, the first insulating film IL1 may comprise a first portion PT1 and a second portion PT2, the first signal-line section may be separated from the second signal-line section by at least the first portion PT1 of the first insulating film IL1 and the second portion PT2 of the first insulating film IL1, and the gate line GL may be disposed between the first portion PT1 of the first insulating film IL1 and the second portion PT2 of the first insulating film IL1.

As shown in FIGS. 2 to 4, the cross-section of the trench set TS may have a shape recessed in the thickness direction of the first insulating film IL1 and may have a trapezoidal shape having a two side surfaces and a lower surface. trench set TS In an embodiment, and the trench set TS may have a concavely curved surface in the thickness direction of the first insulating film IL1.

The depth of the trench set TS may be defined as a vertical distance from the highest point of the upper surface of the first insulating film IL1 to the lowest point of the upper surface of the first insulating film IL1, a vertical distance from the upper surface of the first insulating film IL1 to the lower surface of the first insulating film IL1, or a vertical distance from the upper surface of the first insulating film IL1 to the upper surface of the substrate SUB. When the trench set TS is formed to penetrate the first insulating film IL1, the depth of the trench set TS may be equal to the thickness of the first insulating film IL1. When the trench set TS is recessed by a predetermined thickness of the first insulating film IL1, the depth of the trench set TS may be smaller than the thickness of the first insulating film IL1. When the trench set TS extends to a part of the gate insulating film GI, the depth of the trench set TS may be greater than the thickness of the first insulating film IL1.

The depth of the trench set TS may be greater than that of the first trench T1, and may be equal to the thickness of the first insulating layer IL1. In an embodiment, the depth of the trench set TS may be in a range of 3000 angstrom to 30000 angstroms.

The gate line GL, the data line DL, the source electrode SE, and the drain electrode DE may be disposed in the first insulating film IL1.

The gate line GL, the data line DL, the source electrode SE, and the drain electrode DE may be simultaneously formed and may include the same material.

In an embodiment, a thick copper layer may be included in each of the gate line GL, the data line DL, the source electrode SE, and the drain electrode DE. Copper is a low-resistance metal material. When a wiring set has a thick copper layer, high current efficiency may be provided, and considerable stress may be absorbed during a subsequent process, for example, a bonding process.

When a thick copper layer is included in a wiring set significantly protruding over a surface, it is difficult to realize a fine pattern due to an increase in etch skew. Further, when wirings overlap each other, step coverage may be insufficient due to a large step.

In an embodiment, the gate line GL, the data line DL, the source electrode SE, and the drain electrode DE are formed inside the trench set TS of the first insulating film IL1, so that a fine pattern may be realized even when a thick copper layer is included in each of the aforementioned elements.

For each of the gate line GL, the data line DL, the source electrode SE, and the drain electrode DE, a step may be decreased by the depth of the trench set TS. Further, since the data line and the gate line are arranged on the same plane to prevent a step, wiring may be more stably formed. Moreover, since the thickness of a wiring set may not create a significant step, the wiring may have a sufficient thickness. Advantageously, a fine pattern may be implemented, and thus the aperture ratio of a display device may be optimized.

In an embodiment, the line width and line interval US of the gate lines GL and/or data lines DL fine pattern may be 1.5/1.5 µm or less, or 1.2/1.2 µm or less.

The thickness of each of the gate line GL and the data line DL may be equal to the depth of the second trench T2. The gate line GL and the data line DL may be planarized. In an embodiment, the thickness of each of the gate line GL, the data line DL, the source electrode SE, and the drain electrode DE may be in a range of 3000 angstroms to 30000 angstroms. The thickness of each of the source electrode SE and the drain electrode DE may be unequal to the thickness of each of the gate line GL and the data line DL. Specifically, due to the thickness of the semiconductor layer 111 disposed under the source electrode SE and the drain electrode DE, the source electrode SE and the drain electrode DE may be thinner than the gate line GL and the data line DL.

Each of the gate line GL, the data line DL, the source electrode SE and the drain electrode DE may further include a seed layer SL.

The seed layer SL may be provided inside the second trench T2. The seed layer SL may be disposed on one inner surface of the second trench T2. The seed layer SL may have a lower bottom wall and a side wall inside the second trench T2. The thicknesses of the side wall and lower wall of the seed layer SL may be equal to each other. In an embodiment, the thickness of the lower wall may be greater than the thickness of the side wall.

The seed layer SL may be formed of at least one of various metals, such as at least one of molybdenum (Mo), titanium (Ti), copper (Cu), and palladium (Pd). The seed layer SL may be a single layer including one of the aforementioned metals, or may be a single layer including an alloy of some of the aforementioned metals. In an embodiment, the seed layer SL may include double or more layers.

Since the gate line GL, the data line DL, the source electrode SE and the drain electrode DE are formed in the second trench T2, step-related deterioration may be prevented. Therefore, wiring may be sufficiently stable. Moreover, since the thickness of a wiring set may not cause a significant step, the wiring set may have a sufficient thickness, and thus a fine pattern including a thick copper layer may be implemented. Advantageously, the aperture ratio of a display device may be optimized.

Low reflection layers LR may be disposed on the first insulating film IL1. The low reflection layers LR may at least partially overlap the gate line GL and the data line DL.

When a low-reflection capping layer is introduced, due to a difference in etching speed between the wiring and the low-reflection capping layer, the taper angle of the wiring may increase by about 20° to 30°, or a tip may occur on the wiring. As a result, a step coverage failure may occur during a subsequent process, and thus the wiring may be disconnected.

In an embodiment, the gate line GL and the data line DL are disposed in and planarized by the trench set TS of the first insulating film IL1, so that the occurrence of a tip on the wiring may be prevented. In addition, the taper angle of the wiring is not significantly affected, so that a stable low-reflection structure may be realized.

In an embodiment, the low reflection layer LR may be formed of a metal having low reflectance such as chromium (Cr) or titanium (Ti). The low reflection layer LR may be a single layer including one of the aforementioned metals, may be a single layer including an alloy of some of the aforementioned metals, or may include double or more layers.

If a low reflection layer LR does not sufficiently cover the corresponding/underlying gate line GL or data line DL, the ratio of external light reflected by the wiring and visually recognized by a user of the corresponding display device may be undesirably high, and thus the display quality of the display device may be unsatisfactory. In an embodiment, the width of a low reflection layer LR may be greater than the width of the corresponding gate line GL or data line DL.

Figure 5:
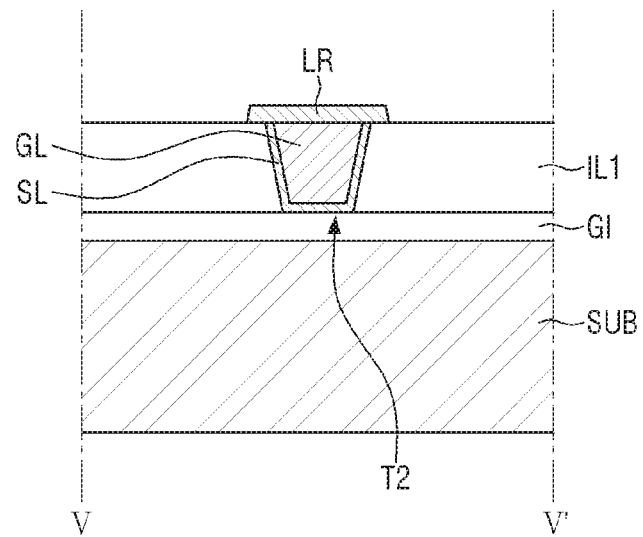
FIG. 5 is a cross-sectional view illustrating a low reflection layer according to an embodiment.

FIGS. 5 to 8 are cross-sectional views of low reflection layers according to one or more embodiments. FIGS. 5 to 8 are cross-sectional views taken along the line V-V' of FIG. 1. As shown in FIG. 5, the width of the low reflection layer LR is greater than the width of the gate line GL and/or the data line DL, and thus the low reflection layer LR may completely cover a face of the gate line GL and/or the data line DL.

Figure 6:
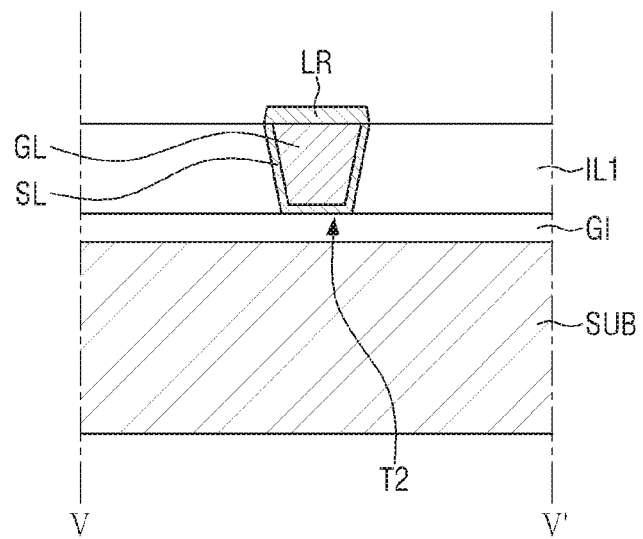
FIG. 6 is a cross-sectional view illustrating a low reflection layer according to an embodiment.

As shown in FIG. 6, the width of the low reflection layer LR is equal to the width of the gate line GL and/or the data line DL, and thus edges of the low reflection layer LR may be aligned/coincide with edges of the gate line GL and/or the data line DL.

Figure 7:
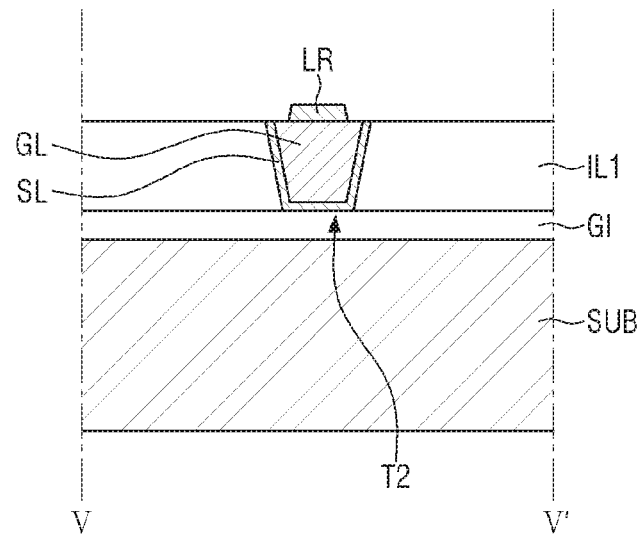
FIG. 7 is a cross-sectional view illustrating a low reflection layer according to an embodiment.

As shown in FIG. 7, the width of the low reflection layer LR is narrower than the width of the gate line GL and/or the data line DL, and a face of the gate line GL and/or the data line DL may be exposed by a predetermined width.

Figure 8:
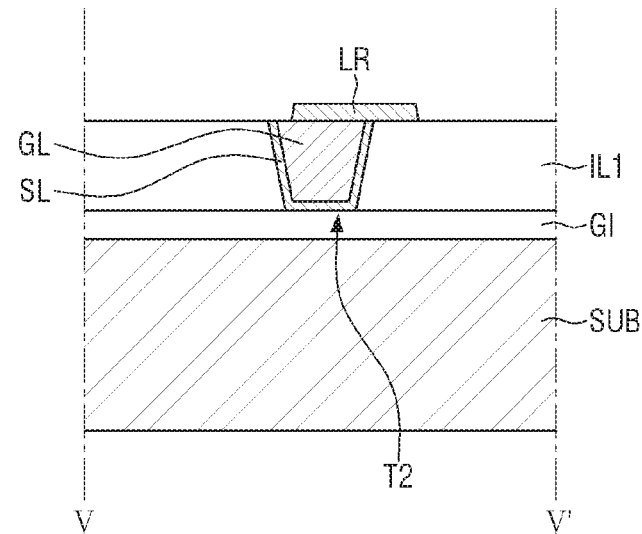
FIG. 8 is a cross-sectional view illustrating a low reflection layer according to an embodiment.

As shown in FIG. 8, the low reflection layer LR may be biased toward one side. Thus, one side of the low reflection layer LR may partially overlap the first insulating film IL1, and the other side of the low reflection layer LR may expose a face of the gate line GL and/or the data line DL by a predetermined width.

The thickness of the low reflection layer LR may be thinner than the thickness of each of the gate line GL and the data line DL. In an embodiment, the thickness of the low reflection layer LR may be in a range from 50 angstroms to 500 angstroms.

A second insulating film IL2 may be disposed on the low reflection layers LR.

The second insulating film IL2 may at least partially cover the low reflection layers LR, the source electrode SE, and/or the drain electrode DE.

The second insulating film IL2 may have a single layer structure or a double layer structure including at least one of silicon nitride, silicon oxynitride, silicon oxide, titanium oxide, and aluminum oxide.

Two second contact holes CN2 may be formed in the second insulating film IL2.

Each contact hole CN2 may penetrate the second insulating film IL2 in the thickness direction to expose an end of a section of the data line DL. The width of each second contact hole CN2 in the first direction X may be greater than the width of the data line DL in the first direction X in order to secure the contact margin of the disconnected data line DL.

In an embodiment, a second contact hole CN2 may expose at least a part of the corresponding low reflection layer LR disposed beneath the second insulation film IL2. A connection pattern CP may at least partially overlap the low reflection layer LR in the second contact hole CN2, and may directly contact the low reflection layer LR.

A pixel electrode PE and a connection pattern CP may be disposed on the second insulating film IL2.

The pixel electrode PE may be electrically connected to the drain electrode DE exposed by the first contact hole CN1. The pixel electrode PE may be formed of a transparent conductive material. For example, the pixel electrode PE may include transparent conductive oxide (TCO) such as indium zinc oxide (IZO), indium tin oxide (ITO), gallium indium zinc oxide (GIZO), or gallium doped zinc oxide (GZO).

The connection pattern CP may be disposed on the second insulating film IL2 and the data line DL, and may at least partially overlap the data line DL. The connection pattern CP includes first regions overlapping the two sections of the data line DL, a second region overlapping the gate line GL, and a third region not overlapping the data line DL or the gate line GL. In the first regions, the connection pattern CP may directly contact and at least partially overlap the ends of the two sections of the data lines DL. The connection pattern CP may be connected to the two sections of the data line DL through the two second contact hole CN2 formed in the first regions and penetrating the second insulating film IL2. The connection pattern CP may electrically connect the two sections of the data lines DL.

In the second region, a portion of the second insulating film IL2 may be provided between the connection pattern CP and the gate line GL. In the second region, the connection pattern CP may overlap the gate line GL, but may not be in direct contact with the gate line GL.

In an embodiment, through the connection pattern CP, a signal transmitted from the data pad DP may be transmitted from one section of the data line DL to another section of the data line DL.

The upper surface of the connection pattern CP may be flat. In an embodiment, the data line DL and the gate line GL may be arranged on the same layer in the second trench T2, so that the upper surface of the second insulating film IL2 may be substantially flat. Thus, since the connection pattern CP is disposed on a substantially flat surface of the second insulating film IL2, no disconnection failure may occur.

The width of the connection pattern CP may be constant as shown in FIG. 1, and the width of the connection pattern CP may be wider than the width of the data line DL. The width and shape of the connection pattern CP may be configured according to embodiments. For example, an end of the connection pattern CP in contact with the data line DL may have a relatively large width as compared with other regions. The end of the connection pattern CP may be larger than the second contact hole CN2. Thus, a contact region between the data line DL and the connection pattern CP may be secured.

The thickness of the connection pattern CP may be different from the thickness of each of the gate line GL, the data line DL, the source electrode SE, and the drain electrode DE. The connection pattern CP may be thinner than each of the gate line GL, the data line DL, the source electrode SE, and the drain electrode DE.

The connection pattern CP may be formed of a transparent conductive material. For example, the connection pattern CP may include transparent conductive oxide (TCO) such as indium zinc oxide (IZO), indium tin oxide (ITO), gallium indium zinc oxide (GIZO), or gallium doped zinc oxide (GZO). In an embodiment, the connection pattern CP may be formed simultaneously with the pixel electrode PE, may be made of the same material as the pixel electrode PE, and/or may have the same thickness as the pixel electrode PE.

Although FIG. 2 shows a structure in which the connection pattern CP is disposed on the data line DL, the connection pattern CP may be disposed beneath the data line DL to connect the two separated sections of the data line DL.

Figure 9:
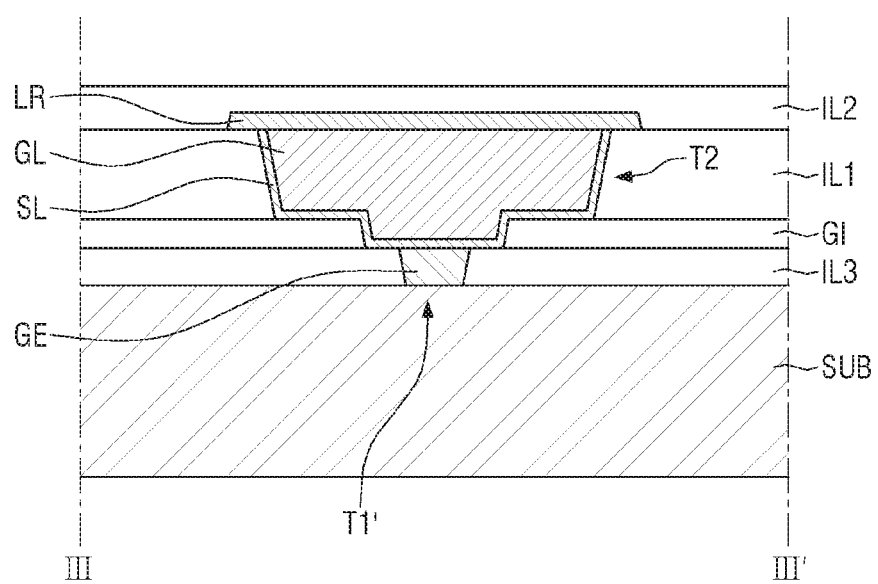
FIG. 9 is a cross-sectional view of a thin film transistor array substrate according to an embodiment.

FIG. 9 is a cross-sectional view of a thin film transistor array substrate 1_1 according to an embodiment. FIG. 9 is a cross-sectional view taken along the line III-III' of FIG. 1. Referring to FIG. 9, the thin film transistor array substrate 1_1 is different from the thin film transistor array substrate 1 illustrated in FIGS. 2 to 4 in that a third insulating film IL3 is provided on the substrate SUB. The third insulating film IL3 may be disposed between the substrate SUB and the first insulating film IL1.

The third insulating film IL3 may be an inorganic film, for example, a silicon nitride layer, a silicon oxynitride layer, a silicon oxide layer, a titanium oxide layer, or an aluminum oxide layer. The third insulating film IL3 may include the same material as the first insulating film IL1 and/or the second insulating film IL2.

A first trench T1 may be formed in the third insulating film IL3. The first trench T1 may have be recessed from the upper surface of the third insulating film IL3. The plan-view shape of the first trench T1 may correspond to the plan-view shape of the gate electrode GE. As shown in FIG. 9, the first trench T1 may be etched in the thickness direction of the third insulating film IL3 to have a side surface and a bottom surface. In an embodiment, the first trench T1 may include a curved surface of the third insulating film IL3. The first trench T1 may penetrate the third insulating film IL3 in the thickness direction to expose a layer directly disposed beneath the third insulating film IL3, for example, the substrate SUB. The depth of the first trench T1 may be defined as a vertical distance from the highest point of the upper surface of the third insulating film IL3 to the lowest point of the upper surface of the third insulating film IL3 or to the lower surface of the third insulating film IL3.

A gate electrode GE may be disposed in the first trench T1 of the third insulating film IL3. Thus, a failure due to the step between the gate electrode GE and the third insulating film IL3 may be prevented. If the gate electrode GE is disposed on one flat surface of the third insulating film IL3, a step may be formed between the gate electrode GE and the third insulating film IL3. In an embodiment, since the gate electrode GE is formed inside the first trench T1 of the third insulating film IL3, the step between the gate electrode GE and the third insulating film IL3 may be reduced by the depth of the first trench T1. Since the upper surface of the gate electrode GE and the upper surface of the third insulating film IL3 are substantially coplanar, the step coverage of the wiring and/or layer disposed on the gate electrode GE and the third insulating film IL3 may be sufficient, and thus the wiring may be sufficiently stable. In an embodiment, the depth of the first trench T1 may be equal to the thickness of the gate electrode GE. In an embodiment, the upper surface of the gate electrode GE and the upper surface of the third insulating film IL3 may be substantially coplanar and may form a substantially flat surface.

In the thin film transistor array film 1_1, no trench may be formed in the substrate SUB to accommodate the gate electrode GE. Advantageously, the strength of the substrate SUB may be optimized.

Figure 10:
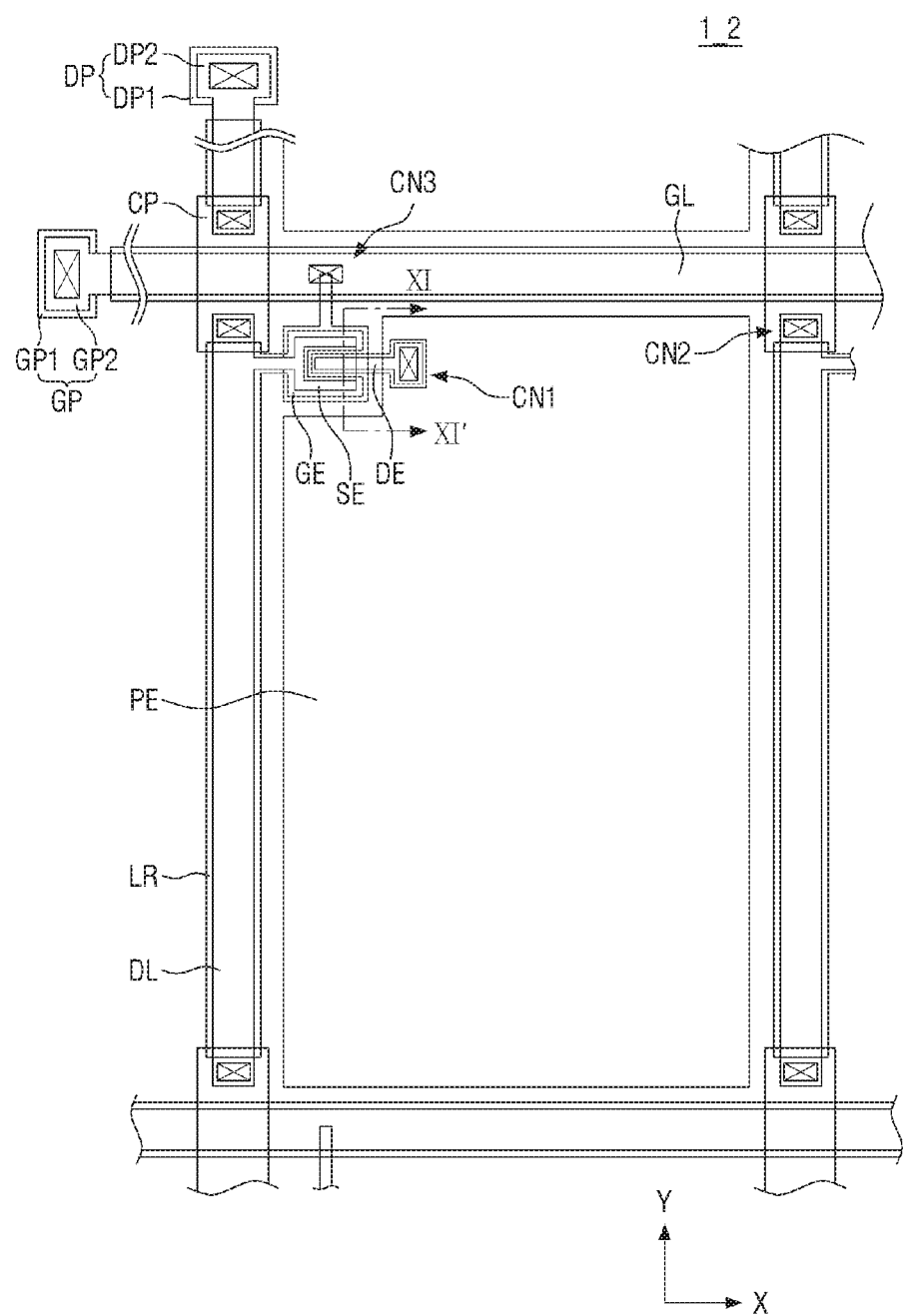
FIG. 10 is a plan view of a thin film transistor array substrate according to an embodiment.
Figure 11:
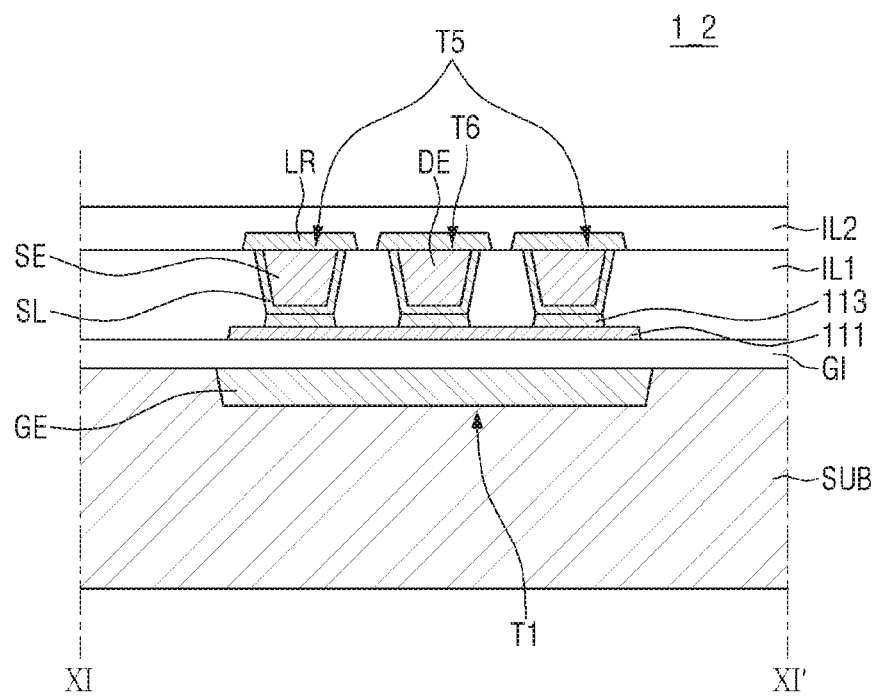
FIG. 11 is a cross-sectional view taken along the line XI-XI' of FIG. 10 according to an embodiment.

FIG. 10 is a plan view of a thin film transistor array substrate 1_2 according to an embodiment. FIG. 11 is a cross-sectional view taken along the line XI-XI' of FIG. 10 according to an embodiment. Referring to FIGS. 10 and 11, the thin film transistor array substrate 1_2 according to an embodiment is different from the thin film transistor array substrate 1 illustrated in FIGS. 2 to 4 in that low reflection layers LR are provided on the source electrode SE and the drain electrode DE.

The low reflection layers LR may at least partially overlap the source electrode SE and the drain electrode DE. The low reflection layers LR may be in direct contact with the source electrode SE and the drain electrode DE. In an embodiment, the low reflection layers LR may overlap the source electrode SE and the drain electrode DE as well as the gate line GL and the data line DL to prevent unwanted reflection. Specifically, the source electrode SE and the drain electrode DE may be made of copper, which is a low-resistance but high reflectance metal material, and external light may be undesirably reflected from the electrodes if the low reflection layers LR are not implemented. In an embodiment, the low reflection layer may overlap the electrodes to prevent or minimize the unwanted reflection, such that satisfactory display quality of the corresponding display device may be attained.

The low reflection layers LR are disposed along the source electrode SE and the drain electrode DE in a plan view. The low reflection layer LR disposed on the source electrode SE and the low reflection layer LR disposed on the drain electrode DE may be spaced from each other. If the low reflection layer LR on the source electrode SE and the low reflection layer LR on the drain electrode DE are in contact with each other, a short may undesirably occur between the source electrode SE and the drain electrode DE. The low reflection layer LR on the source electrode SE and the low reflection layer LR on the drain electrode DE should have widths that sufficiently prevent both the unwanted short circuit and the unwanted light reflection.

The thickness of the low reflection layer LR may be unequal to the thickness of each of the source electrode SE and the drain electrode DE. The low reflection layer LR may be thinner than each of the source electrode SE and the drain electrode DE. The low reflection layer LR overlapping the source electrode SE and the drain electrode DE may be formed simultaneously with the low reflection layer LR overlapping the gate line GL and the data line DL, and may include the same material.

In the thin film transistor array substrate 1_2, low reflection layers LR may be disposed on the source electrode SE and the drain electrode DE to effectively prevent external light from being reflected by the electrodes. No additional black matrix may be required on the source electrode SE and the drain electrode DE to block light; therefore, a manufacturing process may be simplified.

Figure 12:
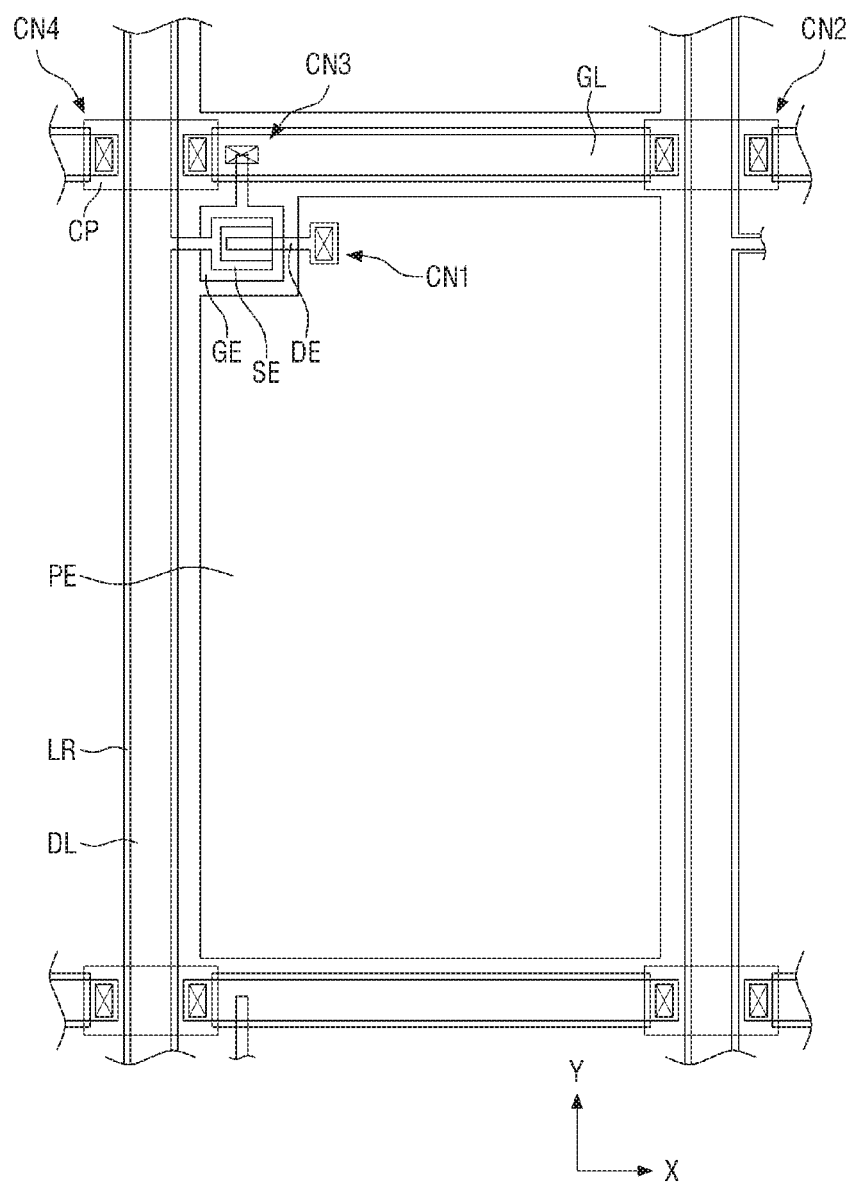
FIG. 12 is a plan view of a thin film transistor array substrate according to an embodiment.

FIG. 12 is a plan view of a thin film transistor array substrate 1_3 according to an embodiment. Referring to FIG. 12, the thin film transistor array substrate 1_3 is different from the thin film transistor array substrate 1 illustrated in FIG. 1 in that the gate line GL includes two gate line sections that spaced from each other.

The data line DL may be positioned between the two sections of the gate line GL. The sections of the gate line GL may be spaced from the data line DL. The sections of the gate lines GL may be electrically connected through the connection pattern CP.

Two low reflection layers LR may extend in the first direction X and may at least partially overlap the two sections of the gate line GL. A low reflection layer LR may extend in the second direction Y and may at least partially overlap the data line DL. The two low reflection layers LR extending in the first direction X may be spaced from and disposed at opposite sides of the low reflection layer LR extending in the second direction Y. The low reflection layers LR overlapping the gate line GL may not overlap the data line DL and may be spaced from the low reflection layer LR overlapping the data line DL. A low reflection layer LR may expose an end of a section of the gate line GL. The end of the section of the gate line GL exposed by the low reflection layer LR may be in contact with the connection pattern CP. The connection pattern CP may be substantially disposed between the sections of the gate lines GL and may be aligned with the sections of the gate line GL in the first direction X.

The connection pattern CP may be disposed on the second insulating film IL2 and the gate line GL, and may at least partially overlap the gate line GL. The connection pattern CP may at least partially overlap the ends of the sections of the gate lines GL. The connection pattern CP may be connected to the two sections of the gate line GL through two fourth contact hole CN4 penetrating the second insulating film IL2. The connection pattern CP may be electrically connected to each of the two sections of the gate lines GL.

In the thin film transistor array substrate 1_3, the gate line GL, the data line DL, the source electrode SE, and the drain electrode DE are formed in the trench set TS of the first insulating film IL1, so that a fine pattern may be implemented even when a thick copper layer is included in each of the aforementioned signal lines and electrodes.

FIGS. 13 to 22 are plan views and cross-sectional views illustrating structures formed in a method of manufacturing a thin film transistor array substrate according to one or more embodiments. Some of the cross-sectional views may be related to cross-sectional views taken along the lines corresponding to XII-XII' shown in FIG. 13.

Referring to FIGS. 1 to 4 and FIGS. 13 to 22, a method of manufacturing a thin film transistor array substrate may include the following steps: providing a substrate SUB, forming a first trench T1 in the substrate SUB, and forming a gate electrode GE, a gate insulating film GI, a semiconductor layer, and an ohmic contact layer 113 on the first trench T1; forming a first insulating film IL1 on the substrate SUB and forming a trench set TS in the first insulating film IL1; forming a seed layer SL in the second trench T2; simultaneously forming a gate line GL, a data line DL, a source electrode SE, and a drain electrode DE in the second trench T2; forming low reflection layers on the gate line GL and the data line DL; forming a second insulating film IL2 on the first insulating film IL1 and forming a first contact hole CN1 and second contact holes CN2 in the second insulating film IL2; and simultaneously forming a pixel electrode PE overlapping the first contact hole CN1 and a connection pattern CP overlapping the second contact holes CN2.

Figure 13:
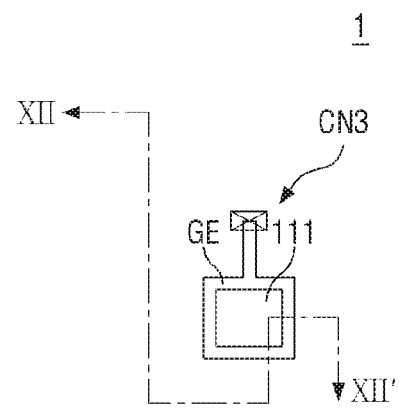
FIG. 13, FIG. 14, FIG. 15, FIG. 16, FIG. 17, FIG. 18, FIG. 19, FIG. 20, FIG. 21, and FIG. 22 are plan views and cross-sectional views illustrating structures formed in a method of manufacturing a thin film transistor array substrate according to one or more embodiments.
Figure 14:
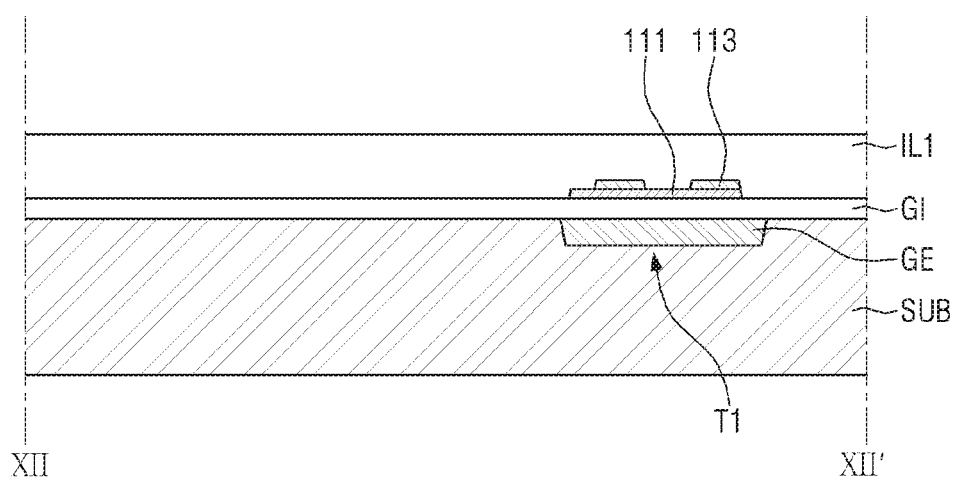

Referring to FIGS. 13 and 14, in the method, a substrate SUB is provided, and a first trench T1 is formed in the substrate SUB. Specifically, a photoresist (not shown) is applied onto the substrate SUB, and then the substrate SUB coated with the photoresist is patterned to form a first mask pattern (not shown). Then, the substrate SUB exposed through the first mask pattern is etched to form a first trench T1 as shown in FIG. 14. After the first trench T1 is formed, the first mask pattern over the substrate SUB is removed.

Subsequently, a gate electrode GE is formed in the first trench T1; a semiconductor layer is formed on the first trench T1. Specifically, a first conductive film (not shown) is formed on the substrate SUB. The first conductive film may be a single layer or may include multiple layers. The first conductive film may be made of at least one of various metals. For example, the first conductive film may be a laminated structure of a barrier metal layer including titanium and a low-resistance metal layer including copper. Subsequently, a second mask pattern (not shown) is formed on the first conductive film by using a second mask. Then, the first conductive film is etched by an etching process using the second mask pattern as an etching barrier to form a gate electrode GE. After the gate electrode GE is formed, the second mask pattern over the substrate SUB is removed. Subsequently, a gate insulating film GI covering the gate electrode GE is formed on the substrate SUB.

Subsequently, a first semiconductor film (not shown) and a second semiconductor film (not shown) are sequentially laminated on the gate insulating film GI. The first semiconductor film may include amorphous silicon. The second semiconductor film may include an amorphous silicon film doped with n-type impurities. The first and second semiconductor films may be separated into different layers by injecting n-type impurities into an amorphous silicon surface after amorphous silicon deposition. Subsequently, a third mask pattern (not shown) is formed by patterning the second semiconductor film using a third mask. In an embodiment, the third mask is a slit mask, and the second semiconductor film is selectively etched by adjusting the thickness of the third mask pattern to form a semiconductor layer 111 and an ohmic contact layer 113. For example, a portion of the second semiconductor film not overlapping the source electrode SE and the drain electrode DE is selectively removed to expose the first semiconductor film, thereby forming the semiconductor layer 111. Accordingly, a channel region may be defined in the semiconductor layer 111. After the semiconductor layer 111 and the ohmic contact layer 113 are formed, the third mask pattern is removed.

Figure 15:
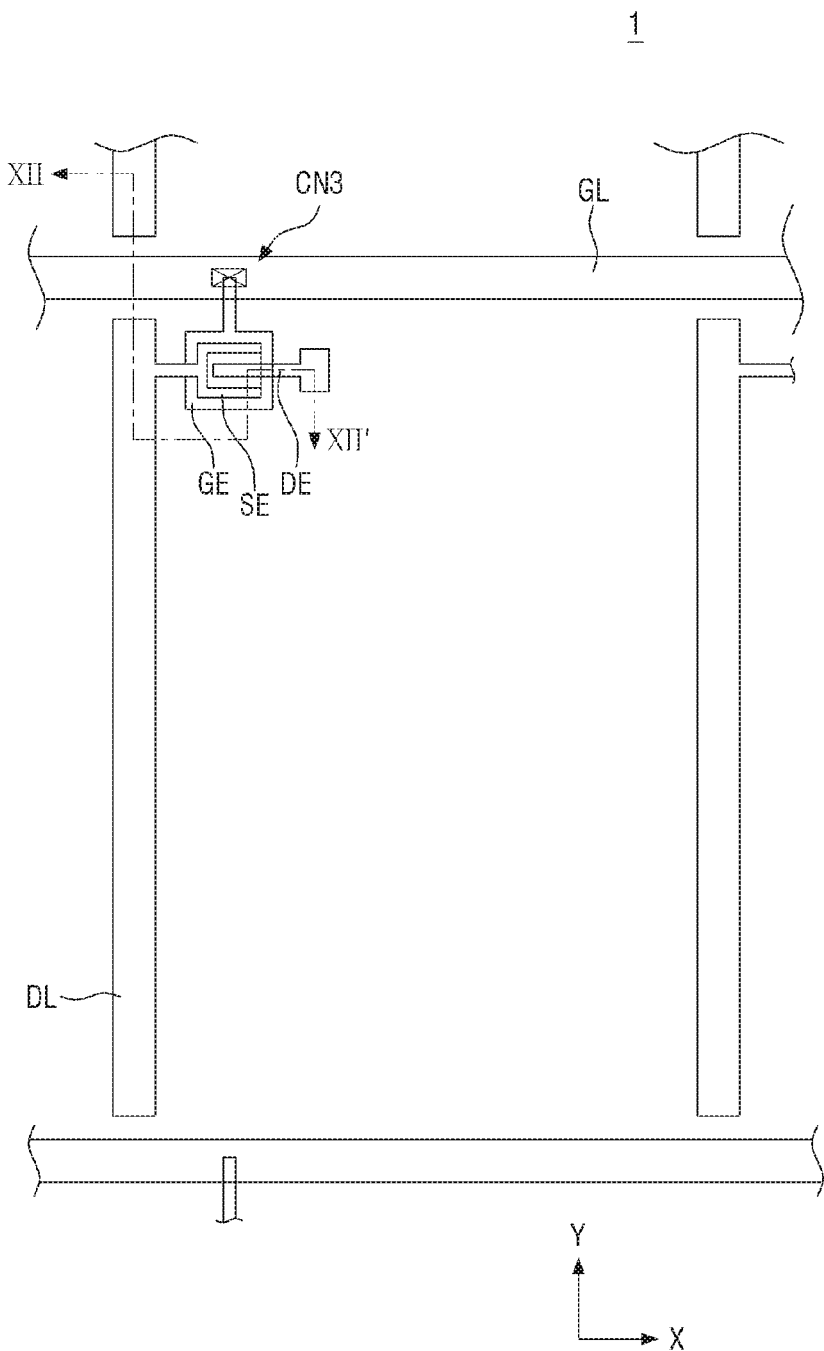
Figure 16:
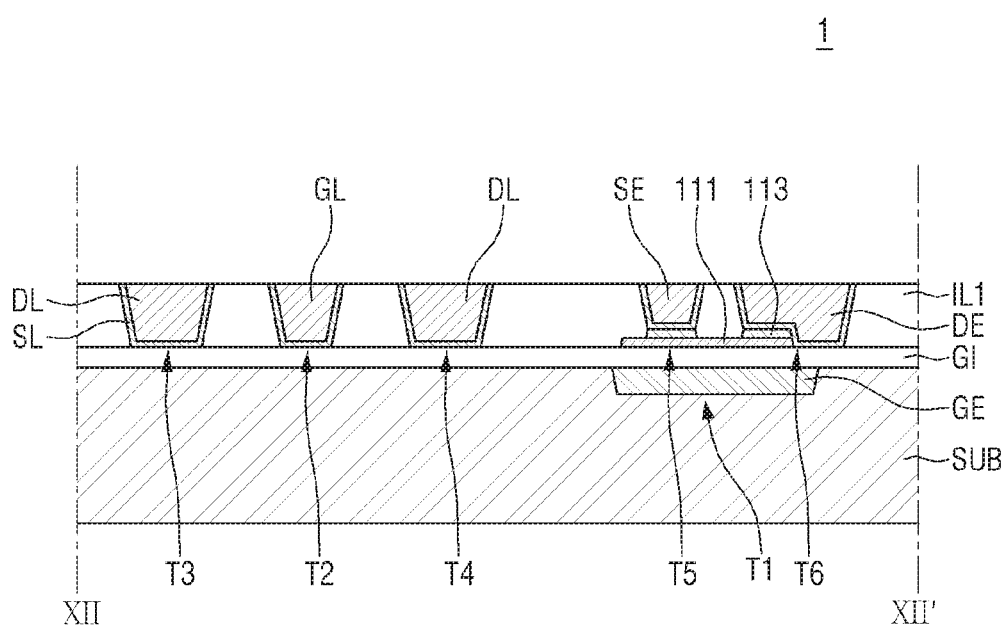

Next, referring to FIGS. 15 and 16, a first insulating film IL1 is formed on the substrate SUB, a trench set TS is formed in the first insulating film IL1, a seed layer SL is formed in the second trench T2, and a gate line GL, a data line DL, a source electrode SE, and a drain electrode DE are simultaneously formed in the second trench T2.

The first insulating film IL1 may be a silicon nitride film (SiNx), and may be formed by, for example, plasma chemical vapor deposition (PECVD). After the deposition of the first insulating film IL1, a fourth mask pattern (not shown) is formed by patterning using a fourth mask. Then, portions of the first insulating film IL1 exposed through the fourth mask pattern is etched to form the trench set TS as shown in FIG. 16. In an embodiment, the taper angle of the trench set TS may be 75° to 90°.

Subsequently, a seed layer SL is formed in the second trench T2; a gate line GL, a data line DL, a source electrode SE, and a drain electrode DE are simultaneously formed in the second trench T2. Specifically, a metal material such as molybdenum (Mo), titanium (Ti), copper (Cu), or palladium (Pd) is applied onto one surface of the first insulating film IL1 by sputtering to form a seed film (not shown). After the seed film is formed, a copper film (not shown) is formed in the trench set TS by electroless plating or sputtering. After the copper film is formed, the surface of the seed film and the surface of the copper film are planarized by a chemical mechanical polishing (CMP) process to form the gate line GL, the data line DL, the source electrode SE, and the drain electrode DE. Top faces the gate line GL, the data line DL, the source electrode SE, and the drain electrode DE may be disposed on the same plane to prevent a step, and a fine pattern may be implemented to improve the aperture ratio of a display device. Since the gate line GL, the data line DL, the source electrode SE, and the drain electrode DE may be formed simultaneously, the manufacturing process of the thin film transistor array substrate may be simplified.

Figure 17:
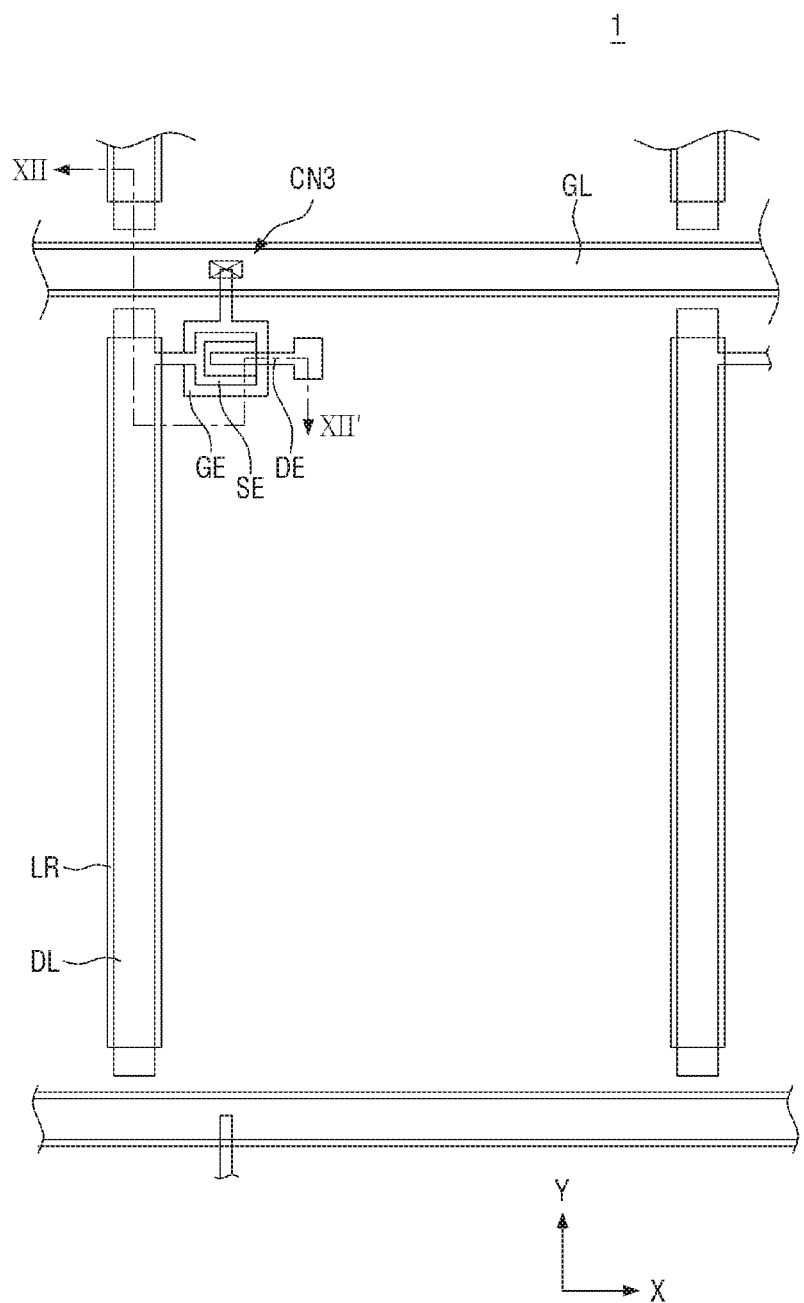
Figure 18:
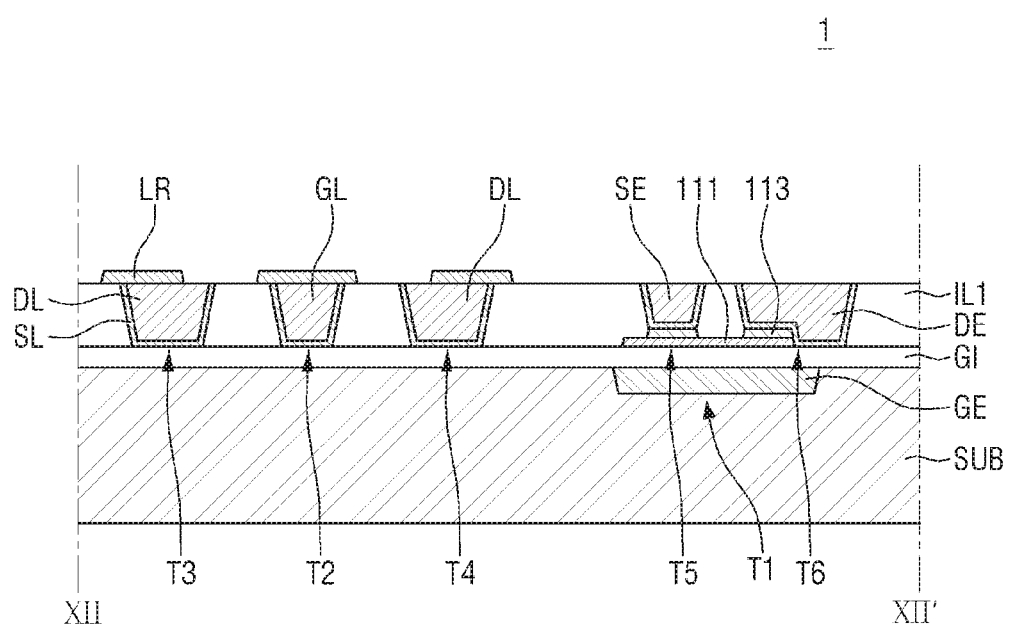

Next, referring to FIGS. 17 and 18, a low reflection layer LR is formed on each of the gate line GL and the data line DL. Specifically, a low reflection film (not shown) is formed on the first insulating film IL1. The low reflection film may be a single layer or may include multiple layers. The low reflection film may be made of a metal having a low reflectance, such as chromium (Cr) or titanium (Ti), or an alloy. The low reflection film may be formed by applying the above material(s) by sputtering. Subsequently, a fifth mask pattern (not shown) is formed by patterning the low reflection film using a fifth mask. Then, the low reflection film is etched by an etching process using the fifth mask pattern as an etching barrier to form the low reflection layer LR.

The low reflection layer LR may prevent unwanted reflection of external light, for ensuring satisfactory display quality of a display device.

Figure 19:
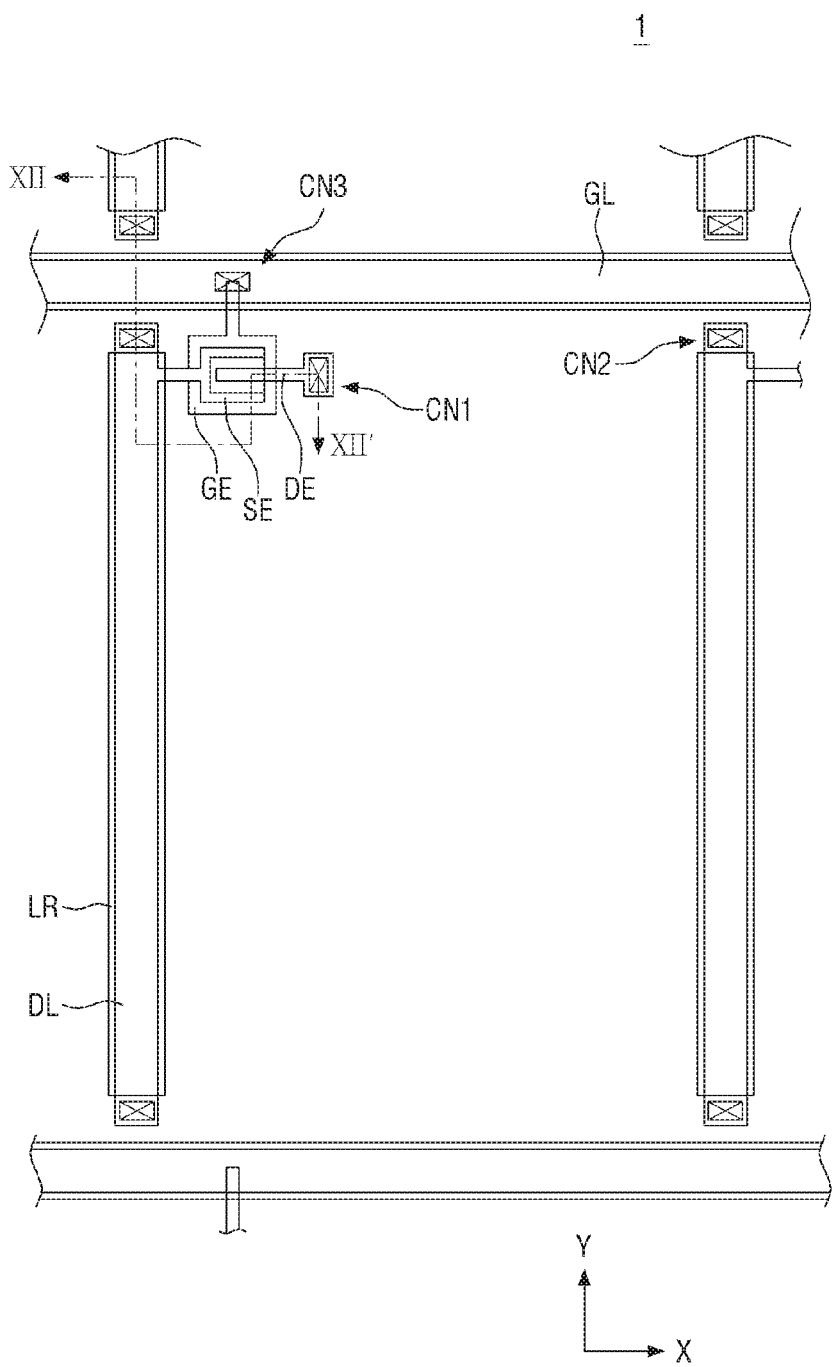
Figure 20:
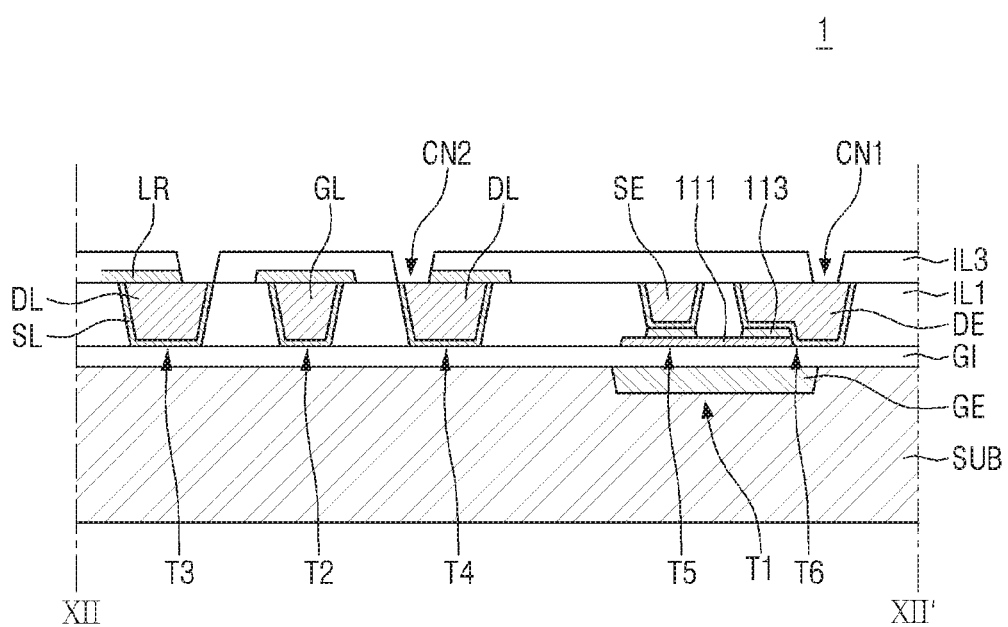

Next, referring to FIGS. 19 and 20, a second insulating film IL2 is formed on the first insulating film IL1, and a first contact hole CN1 and second contact holes CN2 are formed in the second insulating film IL2 using a sixth mask. The first insulating film IL1 may be a silicon nitride film (SiNx), and may be formed by, for example, plasma chemical vapor deposition (PECVD). A first contact hole CN1 and second contact holes CN2, which penetrate the second insulating film IL2 may be formed in the second insulating film IL2. The first contact hole CN1 may expose an end of the drain electrode DE. The second contact hole CN2 may expose two ends of the two sections of the data lines DL. Each second contact hole CN2 may have a width larger than the width of each section of the data line DL to secure a contact margin of the sections of the data line DL and the connection pattern CP.

Figure 21:
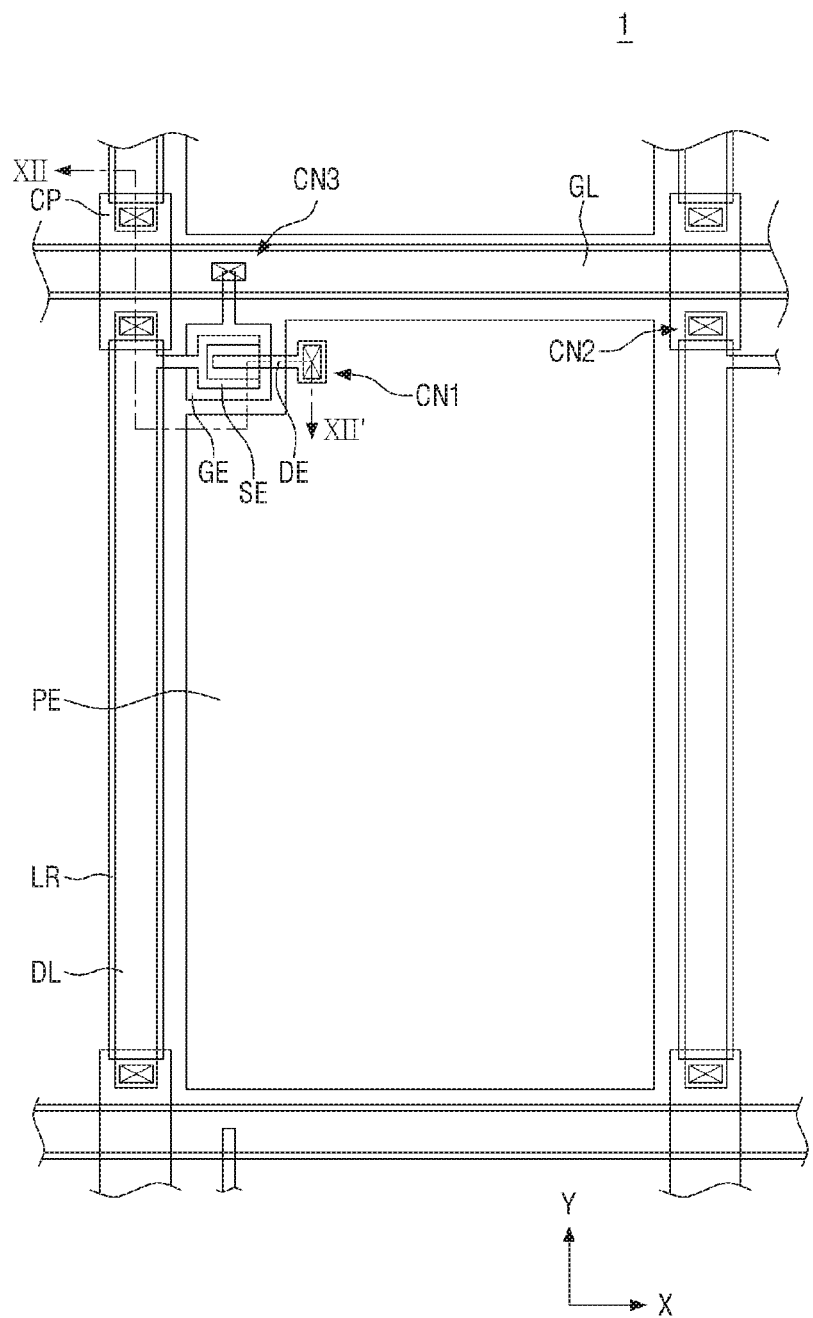
Figure 22:
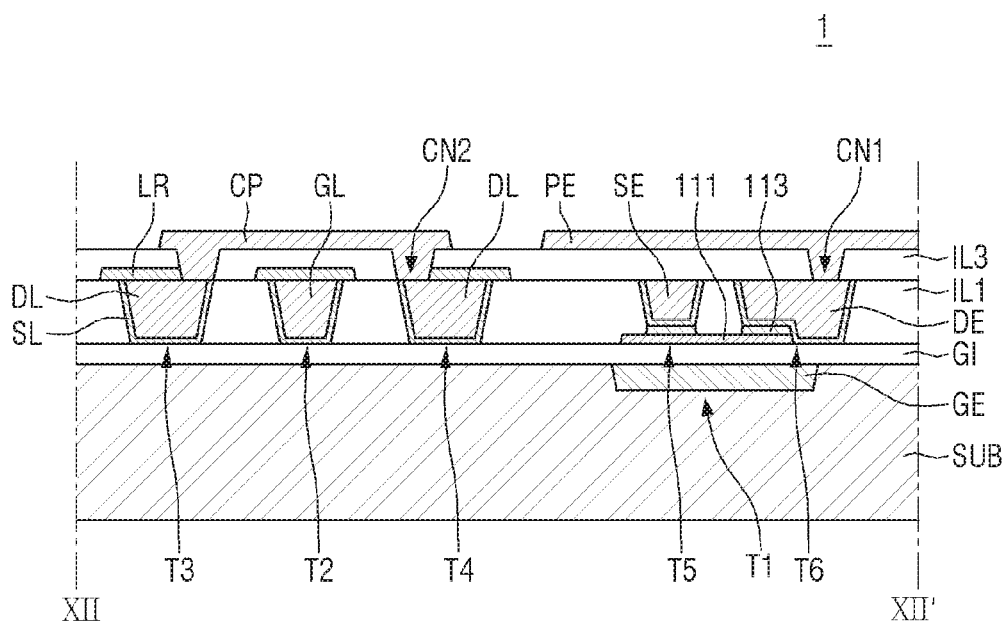

Next, referring to FIGS. 21 and 22, a pixel electrode PE overlapping the first contact hole CN1 and a connection pattern CP overlapping the second contact holes CN2 are formed. Specifically, a transparent electrode material such as IZO, ITO, GIZO, or GZO is entirely deposited on the second insulating film IL2, and the pixel electrode PE and the connection pattern CP are simultaneously patterned using a seventh mask. The pixel electrode PE may be connected to the drain electrode DE through the first contact hole CN1, and the connection pattern CP may be connected to ends of the sections of the data line DL through the second contact holes CN2.

Sections of the data line DL, etc. may be disposed in the trench T2 to prevent a step failure, and the sections of data lines DL may be electrically connected through the connection pattern CP to transmit a signal from the data pad DP. Since the connection pattern CP and the pixel electrode PE can be formed at the same time, the manufacturing process of the thin film transistor array substrate may be simplified.

According to embodiments, thick copper wirings can be disposed in trenches to optimize step coverage characteristics, and a low reflection structure can be implemented to optimize display quality.

According to embodiments, a fine pattern can be implemented using a thick copper layer to optimize the aperture ratio of a display device.

Although example embodiments have been disclosed for illustrative purposes, various modifications, additions, and substitutions are possible, without departing from the scope defined in the accompanying claims.

What is claimed is:

1. A transistor array substrate, comprising:
   a base substrate including a first trench;
   a gate electrode disposed in the first trench;
   an insulating film disposed on the substrate and including a second trench, a third trench, a fourth trench, a fifth trench, and a sixth trench;
   a gate line configured to transmit a gate signal, disposed in the second trench, and extending in a first direction;
   a data line configured to transmit a data signal, extending in a second direction different from the first direction, and including a first signal-line section and a second signal-line section, the first signal-line section being separated from the second signal-line section by at least the gate line and being disposed in the third trench, the second signal-line section being disposed in the fourth trench;
   a source electrode disposed in the fifth trench and electrically connected to the data line; and
   a drain electrode disposed in the sixth trench and spaced from the source electrode,
   wherein the gate electrode is electrically connected to the gate line.

2. The transistor array substrate of claim 1,
   wherein the first signal-line section is separated from the second signal-line section by at least a first portion of the insulating film and a second portion of the insulating film, and wherein the gate line is disposed between the first portion of the insulating film and the second portion of the insulating film.

3. The transistor array substrate of claim 2, further comprising:
   a connection member disposed on the insulating film and electrically connecting the first signal-line section to the second signal-line section.

4. The transistor array substrate of claim 1,
   wherein the gate line comprises gate line sections that are spaced from each other and from the data line.

5. The transistor array substrate of claim 1, further comprising:
   a light-absorbing layer directly contacting and at least partially covering at least one of a face of the gate line and a face of the data line.

6. The transistor array substrate of claim 1, further comprising:
   a light-absorbing layer directly contacting and at least partially covering at least one of a face the source electrode and a face of the drain electrode.

7. The transistor array substrate of claim 1,
   wherein the gate line is electrically connected to the gate electrode, wherein the data line is electrically connected to the source electrode, and wherein the gate line, the data line, the source electrode, and the drain electrode include the same material.

8. The transistor array substrate of claim 7,
   wherein each of the gate line, the data line, the source electrode, and the drain electrode includes copper (Cu).

9. The transistor array substrate of claim 1,
   wherein the base substrate comprises a base layer and an insulating layer, wherein a material of the base layer is different from a material layer of the insulating layer, and wherein the first trench is disposed in at least the insulating layer.

10. The transistor array substrate of claim 9,
    wherein the gate electrode directly contacts each of the base layer and the insulating layer.

11. The transistor array substrate of claim 9,
    wherein the gate electrode directly contacts a face of the base layer, and wherein the insulating layer directly contacts the face of the base layer.

12. The transistor array substrate of claim 9,
    wherein a thickness of the gate electrode is equal to a thickness of the insulating layer.

13. The transistor array substrate of claim 9, further comprising:
    a light-absorbing layer directly contacting and at least partially covering the gate line or the data line, wherein the gate line or the data line is a gate line and is electrically connected to the gate electrode.

14. The transistor array substrate of claim 13,
    wherein the gate electrode is thinner than the gate line and thicker than the light-absorbing layer in a direction perpendicular to the base layer.

15. The transistor array substrate of claim 1,
    wherein at least two of a thickness of the gate line, a thickness of the data line, and a thickness of the insulating film are equal to each other.

16. The transistor array substrate of claim 15,
    wherein each of the thickness of the gate line and the thickness of the second-type line is in a range of 3000 angstroms to 30000 angstroms.

17. A method of manufacturing a transistor array substrate, the method comprising:
    forming a first trench in a substrate;
    forming a gate electrode in the first trench;
    forming an insulating film on the gate electrode;
    forming a second trench, a third trench, a fourth trench, a fifth trench, and a sixth trench in the insulating film, wherein a lengthwise direction of the third trench is different from a lengthwise direction of the second trench and is identical to a lengthwise direction of the fourth trench, and wherein the third trench is separated from the fourth trench by at least the second trench;
    simultaneously forming a gate line, a first section of a data line, a second section of the data line, a source electrode, and a drain electrode in the second trench, the third trench, the fourth trench, the fifth trench, and the sixth trench, respectively;
    forming a connection member that connects the first section of a data line to the second section of the data line; and
    forming a pixel electrode on the insulating film.

18. The method of claim 17,
    wherein the forming of the connection member is performed simultaneously with the forming of the pixel electrode.

19. The method of claim 18,
wherein the forming of the gate signal line, the first section of the data line, the second section of the data line, the source electrode, and the drain electrode includes plating a metal including copper (Cu).

20. The method of claim 19, further comprising:
forming a light-absorbing layer that directly contacts and at least partially covers at least one of the gate line and the data line.

\* \* \* \* \*